United States Patent
Imonigie et al.

(10) Patent No.: US 9,653,307 B1
(45) Date of Patent: May 16, 2017

(54) SURFACE MODIFICATION COMPOSITIONS, METHODS OF MODIFYING SILICON-BASED MATERIALS, AND METHODS OF FORMING HIGH ASPECT RATIO STRUCTURES

(71) Applicant: Micron Technology, Inc., Boise, ID (US)

(72) Inventors: Jerome A. Imonigie, Boise, ID (US); Ian C. Laboriante, Boise, ID (US); Michael T. Andreas, Boise, ID (US); Sanjeev Sapra, Boise, ID (US); Prashant Raghu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/210,249

(22) Filed: Jul. 14, 2016

(51) Int. Cl.
*H01L 21/306* (2006.01)
*C09D 5/16* (2006.01)
*C09D 7/12* (2006.01)

(52) U.S. Cl.
CPC .......... *H01L 21/306* (2013.01); *C09D 5/1625* (2013.01); *C09D 7/1233* (2013.01)

(58) Field of Classification Search
None
See application file for complete search history.

(56) References Cited

U.S. PATENT DOCUMENTS

| | | |
|---|---|---|
| 6,767,587 B1 | 7/2004 | Brown |
| 7,125,781 B2 | 10/2006 | Manning et al. |
| 7,309,902 B2 | 12/2007 | Reboa |
| 7,517,546 B2 | 4/2009 | Hofer et al. |
| 7,892,937 B2 | 2/2011 | Rana et al. |
| 8,178,004 B2 | 5/2012 | Hanson |
| 8,183,157 B2 | 5/2012 | Rana et al. |
| 8,617,993 B2 | 12/2013 | Yasseri et al. |
| 8,932,933 B2 | 1/2015 | Laboriante et al. |
| 2003/0139486 A1* | 7/2003 | Yamada .......... C08F 2/44 522/71 |
| 2005/0095840 A1* | 5/2005 | Bhanap .......... H01L 21/02203 438/623 |
| 2008/0194494 A1* | 8/2008 | Martinez .......... C07D 205/08 514/25 |
| 2008/0206950 A1 | 8/2008 | Bhat et al. |
| 2013/0081301 A1 | 4/2013 | Gouk et al. |
| 2015/0034245 A1* | 2/2015 | Hashizume .......... H01L 21/67063 156/345.11 |
| 2016/0086829 A1 | 3/2016 | Limary et al. |
| 2016/0099160 A1 | 4/2016 | Sirard et al. |

* cited by examiner

*Primary Examiner* — Asok K Sarkar
(74) *Attorney, Agent, or Firm* — TraskBritt (57) ABSTRACT

A surface modification composition comprising a silylation agent comprising a silyl acetamide, a silylation catalyst comprising a perfluoro acid anhydride, an amine-based complexing agent, and an organic solvent. Methods of modifying a silicon-based material and methods of forming high aspect ratio structures on a substrate are also disclosed.

25 Claims, 5 Drawing Sheets

SURFACE MODIFICATION COMPOSITIONS, METHODS OF MODIFYING SILICON-BASED MATERIALS, AND METHODS OF FORMING HIGH ASPECT RATIO STRUCTURES

TECHNICAL FIELD

Embodiments disclosed herein relate to semiconductor fabrication including compositions for forming hydrophobic surfaces, and methods of using the compositions. More particularly, embodiments of the disclosure relate to surface modification compositions, methods of using the surface modification compositions, and methods of forming high aspect ratio structures.

BACKGROUND

Figure 1:
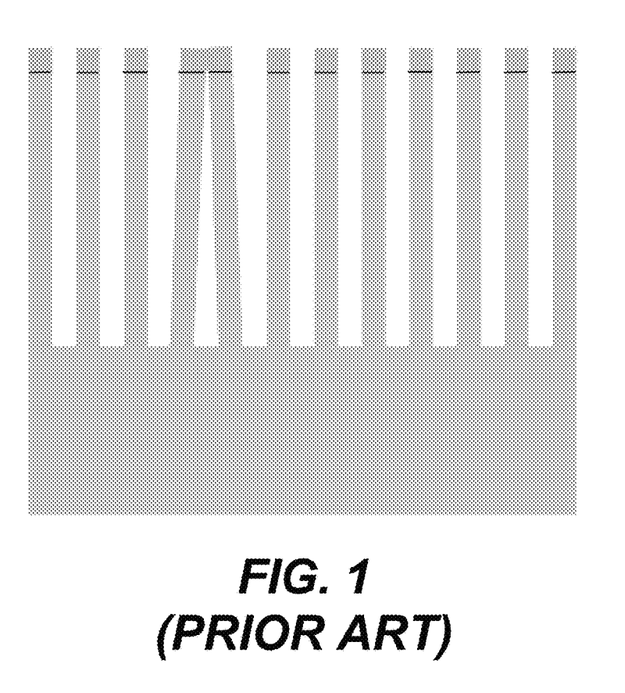
FIG. 1 is a schematic illustration showing toppling of HAR structures following exposure to conventional surface modification chemistries.

A continuing goal of integrated circuit fabrication is to increase integration density. One approach used to achieve increased integration density involves reducing the lateral footprint of individual structures by increasing the aspect ratio (i.e., ratio of height to width or diameter) of the individual structures and the proximity of adjacent structures. However, one problem with this approach is that spaces between closely adjacent high aspect ratio (HAR) structures can act as capillaries during post-formation processes (e.g., "release-related" processes such as cleaning, rinsing, and drying, and "in-use" processes such as post-drying processes), such that liquid (e.g., water or other solvent) is drawn into such spaces. High surface tension forces resulting from the liquid in the spaces between adjacent HAR structures can cause the adjacent HAR structures to topple or collapse toward each other, bringing the adjacent HAR structures into contact with each other, as shown in FIG. 1. The gap between the adjacent HAR structures can produce surface forces (e.g., Van der Waals, electrostatic, hydrogen bonding, capillary, solid bridging, etc.) that cause the adjacent HAR structures to statically adhere to each other. Such static adhesion is commonly referred to in the art as "stiction." Stiction between the adjacent HAR structures can substantially impede desired functions of a semiconductor device structure or even render the semiconductor device structure inoperable (e.g., by substantially damaging components of the semiconductor device structure).

The HAR structures may include features formed of a silicon-based material, such as silicon, silicon oxide, or silicon nitride. After forming the HAR structures, a wet chemistry is used to remove (e.g., clean) residues and to prepare the surface of the HAR structures for subsequent process acts. Various wet chemistries have been investigated to reduce the surface tension or increase a contact angle between the wet chemistry and the surface of the HAR structures. The wet chemistry is followed by drying to remove the wet chemistry. The drying of the HAR structures includes heating or using an isopropanol (IPA) rinse, which has a low surface tension. The HAR structures may be exposed to multiple wet chemistry and drying acts during the overall fabrication process.

Conventional methods of reducing toppling include rinsing the HAR structures with low surface tension liquids, such as isopropanol (IPA) or fluorinated organic surfactants, followed by drying with nitrogen ($N_2$). While IPA is effective in reducing surface tension, the IPA does not increase the contact angle. Modifications of the surface of the HAR structures have also been investigated to reduce toppling. Hexamethyldisiloxane (HMDS) or fluorinated silanes have been bonded to the surface of the HAR structures to increase the contact angle. However, the resulting contact angles are less than 90°. Moreover, the surface modifications do not prevent collapse as the aspect ratio of the HAR structures increases above about 22:1.

A need, therefore, exists for developing additional compositions and methods of reducing toppling of adjacent HAR structures of a semiconductor device structure.

DETAILED DESCRIPTION

Figure 2:
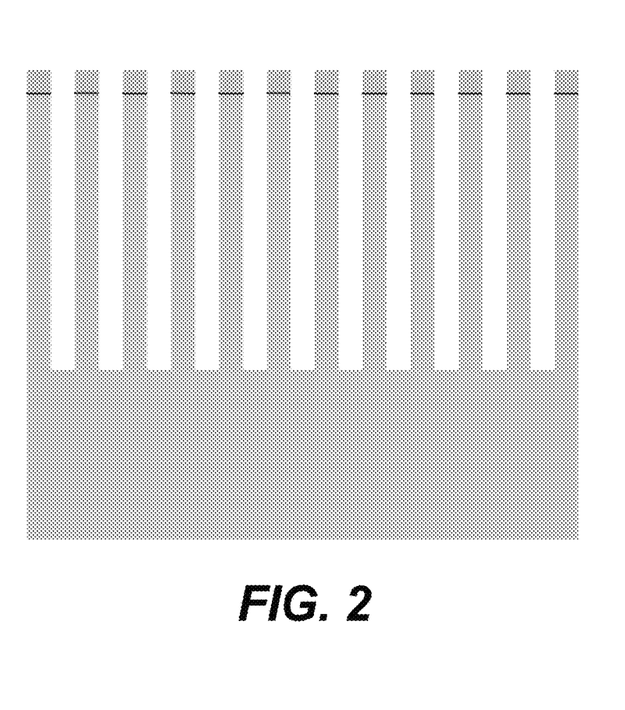
FIG. 2 is a schematic illustration showing zero toppling of HAR structures following exposure to a surface modification composition according to embodiments of the disclosure.

Compositions for modifying a silicon-based material are disclosed, as are methods of modifying the silicon-based material and methods of forming HAR structures including the silicon-based material. The surface modification composition includes a silylation agent, a silylation catalyst, an amine-based complexing agent, an optional chelating agent, and an organic solvent. The silylation agent reacts with functional groups on the surface of the silicon-based material, modifying the surface of the silicon-based material. The modified surface of the silicon-based material has an increased hydrophobicity relative to the hydrophobicity of the silicon-based material. By increasing the surface's hydrophobicity, a contact angle between the silicon-based material and a liquid (e.g., the surface modification composition or a subsequently-used wet chemistry) is increased, which reduces or eliminates toppling of the HAR structures, as illustrated in FIG. 2. The contact angle may be greater than or equal to about 90° for a silicon oxide material, such as greater than or equal to about 100° or greater than or equal to about 110°. For a silicon nitride material, the contact angle may be greater than or equal to about 60°, such as greater than or equal to about 70°. The surface modification composition according to embodiments of the disclosure may reduce or eliminate toppling of the HAR structures during post-formation processes.

Interactions between the surface of the HAR structures and the surface modification composition are governed by the equation below:

$$F = 2\gamma * \cos\theta / s * h * d,$$

where F is the Laplace force, γ is the surface tension, θ is the contact angle between the liquid of the wet chemistry and the HAR structures, s is the space of the HAR structures, h is the height of the HAR structures, and d is the depth of the HAR structures. For particular HAR structures, s, h, and d are dependent on the size of the HAR structures and cannot be changed to reduce the Laplace force. Without being bound by any theory, it is believed that the surface modification composition according to embodiments of the disclosure increases the contact angle (θ) between the surface modification composition and the HAR structures, which reduces the Laplace force.

The illustrations included herewith are not meant to be actual views of any particular systems or memory structures, but are merely idealized representations that are employed to describe embodiments described herein. Elements and features common between figures may retain the same numerical designation except that, for ease of following the description, for the most part, reference numerals begin with the number of the drawing on which the elements are introduced or most fully discussed.

The following description provides specific details, such as materials and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device structure or a complete process flow for manufacturing a semiconductor device structure and the semiconductor device structures described below do not form a complete semiconductor structure. Only those process acts and structures necessary to understand the embodiments described herein are described in detail below. Additional acts to form a complete semiconductor device structure including the structures described herein may be performed by conventional techniques.

As used herein, the term "silicon-based material" means and includes a chemical compound including silicon atoms or combinations of silicon atoms and one or more of nitrogen atoms, oxygen atoms, phosphorus atoms, or fluorine atoms. The silicon-based material may include, but is not limited to, silicon (i.e., monocrystalline silicon, polycrystalline silicon, tetraethylorthosilicon (TEOS), phosphosilicate glass (PSG), borophosphosilicate glass (BPSG), fluorosilicate glass (FSG)), a silicon oxide (i.e., silicon oxide, silicon dioxide), a silicon nitride (i.e., $Si_4N_3$), or combinations thereof. The silicon-based material may also include hydrogen atoms, such as in the alpha (α) form of silicon nitride.

As used herein, the term "HAR structure" means and includes a feature formed from the silicon-based material on a substrate and having an aspect ratio (ratio of the feature's height to width) of greater than about 10 (i.e., 10:1), such as from about 10:1 to about 40:1, from about 15:1 to about 40:1, from about 20:1 to about 40:1, or from about 25:1 to about 40:1. Adjacent HAR structures may be spaced apart by a distance of less than or equal to about 100 nm, such as less than or equal to about 50 nm, less than or equal to about 30 nm, or less than or equal to about 20 nm.

As used herein, the term "surface modification composition" means and includes a mixture of the silylation agent, silylation catalyst, amine-based complexing agent, optional chelating agent, and organic solvent. The surface modification composition may be a solution of the silylation agent, silylation catalyst, amine-based complexing agent, optional chelating agent, and organic solvent. However, depending on the solubility of the chelating agent in the organic solvent, the surface modification composition may be a suspension or an emulsion.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the term "contact angle" means and includes an angle between a liquid-solid interface and a plane tangent to the liquid-gas interface at a point where a droplet of liquid (e.g., the silicon modification chemistry) meets the solid surface.

The silylation agent may be a silyl acetamide compound having a carbon-nitrogen double bond, such as an N,O-bis(trialkylsilyl)acetamide or an N,O-bis(trialkylsilyl)haloacetamide. The silylation agent may include, but is not limited to, N,O-bis(trimethylsilyl)acetamide (BSA), N,O-bis(triethylsilyl)acetamide, N,O-bis(tripropylsilyl)acetamide, N,O-bis(trimethylsilyl)trifluoroacetamide (BSTFA), or combinations thereof. Such silylation agents are commercially available from numerous sources. The silylation agent may react with hydroxyl groups or amine groups on the surface of the silicon-based material to modify the silicon-based material. By including the carbon-nitrogen double bond, the silylation agent may be more reactive with the silicon-based material than conventional silylation agents, such as HMDS. In some embodiments, the silylation agent is BSA. In other embodiments, the silylation agent is BSTFA. The silylation agent may account for from about 1 wt % to about 20 wt % of the surface modification composition.

The reaction of the silylation agent with the silicon-based material may be catalyzed by the silylation catalyst. The silylation catalyst may be a perfluoro acid anhydride, such as trifluoroacetic anhydride (TFAA), pentafluoropropionic anhydride (PFPA), heptafluorobutyric anhydride (HFBA), or combinations thereof. Such silylation catalysts are commercially available from numerous sources. In some embodiments, the silylation catalyst is TFAA. The silylation catalyst may account for from about 0.05 wt % to about 5 wt % of the surface modification composition.

The reaction of the silylation agent with the silicon-based material may be further catalyzed by the amine-based complexing agent. The amine-based complexing agent may be a bidentate or polydentate amine compound. The amine-based complexing agent may include, but is not limited to, ethylenediamine (EDA), ethylenediamine tetraacetic acid (EDTA), diethylenetriamine, diethylenetriaminepentaacetic acid (DTPA), trimethylenediamine (TMEDA), triethylenetetramine, pentaethylenehexamine, N,N-dimethyltrimethylenediamine, tetramethylethylenediamine, tetraethylenepentamine (TEPA), N,N-diisopropylethylamine, triethylamine (TEA), imidazole, 4-dimethylaminopyridine (DMAP), 3-amino-2,6-dimethylpyridine, nitrilotriacetic acid (NTA), or combinations thereof. Such amine-based complexing agents are commercially available from numerous sources. In some embodiments, the amine-based complexing agent is EDA. The amine-based complexing agent may account for from about 0.05 wt % to about 5 wt % of the surface modification composition.

The chelating agent may be a dicarboxylic acid or polycarboxylic acid having at least one hydroxyl group bonded to a carbon atom alpha ($\alpha$) to the carbon atom of the carboxylic acid. The chelating agent may be an $\alpha$-hydroxy carboxylic acid including, but not limited to, citric acid, lactic acid, malic acid, glycolic acid, tartaric acid, mandelic acid, (R)-(-)-citramalic acid, gluconic acid, gallic acid, or combinations thereof. Such $\alpha$-hydroxy carboxylic acids are commercially available from numerous sources. The chelating agent, when present, may react with the hydroxyl groups or amine groups of the silicon-based material, forming a chelate or complex. The $\alpha$-hydroxy group(s) of the chelate or complex of the chelating agent may then react with the silylation agent. In some embodiments, the chelating agent is citric acid. In other embodiments, the chelating agent is tartaric acid. When present, the chelating agent may account for from about 0.05 wt % to about 5 wt % of the surface modification composition.

The organic solvent may be an aprotic, polar solvent, such as an ester, an ether, an acetate, or an amide solvent. By way of example only, the organic solvent may be propylene glycol monomethyl ether acetate (PGMEA), tetrahydrofurfuryl acetate (THFAC), dimethylacetamide (DMA), propylene carbonate (PC), N-methylpyrrolidone, tetrahydrofuran, ethyl acetate, acetone, N,N-dimethylformamide, acetonitrile, dimethyl sulfoxide, or combinations thereof. Such organic solvents are commercially available from numerous sources. In some embodiments, the organic solvent is PGMEA. The organic solvent may account for the remainder of the surface modification composition, such as from about 70 wt % to about 98.9 wt % of the surface modification composition.

The surface modification composition should be free of water (e.g., moisture) and alcohol solvents to prevent undesired reactions during the surface modification of the silicon-based material.

In some embodiments, the surface modification composition includes PGMEA, BSA, TFAA, and EDA. In other embodiments, the surface modification composition includes PGMEA, BSA, TFAA, EDA, and citric acid. In yet other embodiments, the surface modification composition includes PGMEA, BSA, TFAA, EDA, and tartaric acid.

In some other embodiments, the surface modification composition includes PGMEA, BSTFA, TFAA, and EDA. In other embodiments, the surface modification composition includes PGMEA, BSTFA, TFAA, EDA, and citric acid. In yet other embodiments, the surface modification composition includes PGMEA, BSTFA, TFAA, EDA, and tartaric acid.

Accordingly, a surface modification composition is disclosed. The surface modification composition comprises a silylation agent comprising a silyl acetamide, a silylation catalyst comprising a perfluoro acid anhydride, an amine-based complexing agent, and an organic solvent.

The surface modification composition may be formed by combining the organic solvent, silylation agent, silylation catalyst, amine-based complexing agent, and chelating agent, if present, with mixing. The ingredients of the surface modification composition may be combined just before the point of use. Alternatively, stable ingredients of the surface modification composition may be combined and stored, with the remaining ingredients added just before use. Alternatively, the organic solvent, silylation catalyst, amine-based complexing agent, and chelating agent, if present, may be combined and introduced into a tool through a first line and the silylation agent introduced into the tool through a second line.

Additionally, if the chelating agent is soluble in the organic solvent, the chelating agent may be combined with the other ingredients of the surface modification composition. If, however, the chelating agent is not soluble in the organic solvent of the surface modification composition, the chelating agent may be separately applied to the HAR structures before exposing the HAR structures to the surface modification composition. If the chelating agent is separately applied to the HAR structures, the chelating agent may be sprayed, immersed, or otherwise applied to the HAR structures.

Figure 3:
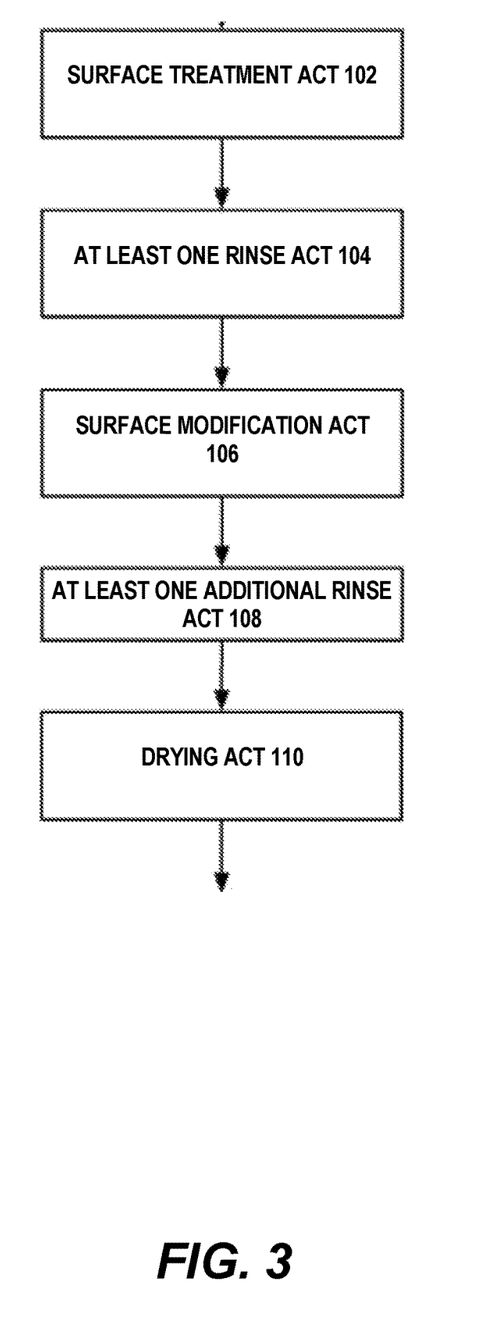
FIG. 3 is a flowchart of methods of modifying the silicon-based material according to embodiments of the disclosure.

Embodiments of methods of modifying the silicon-based material are as illustrated in the flowchart of FIG. 3. To modify the silicon-based material, the silicon-based material may be subjected to a surface treatment act 102. The silicon-based material may be grown on the substrate or formed on the substrate by conventional techniques, which are not described in detail herein. In some embodiments, the silicon-based material includes a stack of silicon, silicon oxide on the silicon, and silicon nitride on the silicon oxide. Features formed from the silicon-based material have an aspect ratio of greater than or equal to about 10:1 and adjacent features are spaced apart from one other by less than or equal to about 100 nm. The features are exposed to a wet chemistry to prepare the surface of the silicon-based material for modification. The wet chemistry may also remove residues and unreacted species from the surface of the features, such as residues and unreacted species from previously-conducted processing acts. The wet chemistry may be aqueous-based and include, but not limited to, one or more of dilute hydrogen fluoride (HF), ammonium hydroxide ($NH_4OH$), or an ammonium peroxide mixture (APM). The dilute HF may include 300:1 water:HF, 500:1 water:HF, or 1000:1 water:HF. The ammonium hydroxide may include 0.5 wt % ammonium hydroxide. The APM may include 0.5:1 wt % of ammonium hydroxide:hydrogen peroxide. The wet chemistry may be drawn into spaces between the features and fill the spaces. The features may be exposed to the wet chemistry for an amount of time sufficient to prepare the surface of the features and remove residues and unreacted species, such as from about 10 seconds to about 120 seconds, from about 30 seconds to about 90 seconds, or from about 30 seconds to about 60 seconds.

The features may then be subjected to at least one rinse act 104. The substrate having the features may be exposed to a first rinse, such as water (e.g., deionized water (DIW) or other aqueous-based wet chemistry), to wet the surface of the features, remove any unreacted species from previously-conducted process acts, and remove any wet chemistry remaining following the surface treatment act 102. By way of example only, the first rinse may replace the wet chemistry between the features with water. The first rinse may contact the features for an amount of time of from about 10 seconds to about 120 seconds, from about 30 seconds to about 90 seconds, or from about 30 seconds to about 60 seconds. The features may then be exposed to a second rinse, such as isopropanol (IPA) or other azeotropic solvent, to transition from the aqueous-based first rinse to a solvent-based second rinse. The second rinse may replace the first rinse (e.g., water) in the spaces between the features with IPA. The second rinse may contact the features for an amount of time of from about 10 seconds to about 120 seconds, from about 30 seconds to about 90 seconds, or from about 30 seconds to about 60 seconds. While not indicated in FIG. 3, additional wet chemistries (e.g., additional aqueous- or solvent-based rinses) may be performed before conducting the surface modification of the features.

If the chelating agent is not soluble in the organic solvent of the surface modification composition, the chelating agent may be separately applied to the features before the surface modification act 106, such as in an additional surface treatment act 102 or after the at least one rinse act 104. If the chelating agent is separately applied to the features, the chelating agent may be sprayed, immersed, or otherwise contacted with the features.

The surface of the features may then be modified by conducting a surface modification act 106. The features may be exposed to a surface modification composition according to embodiments of the disclosure. The surface modification act 106 is described in more detail below. Depending on the wet chemistries used in the surface treatment act 102 and the at least one rinse act 104, the surface modification composition may also remove the wet chemistries from between the features. The surface modification composition may be applied to the substrate having the features by spraying, spin-coating, immersion, or other suitable technique that does not damage the features. The features may be exposed to the surface modification composition for an amount of time sufficient for the hydroxyl groups or the amine groups of the silicon-based material to react with the silylation agent, such as from about 10 seconds to about 120 seconds, from about 30 seconds to about 90 seconds, or from about 30 seconds to about 60 seconds. The features may be exposed to the surface modification composition at a temperature of from about room temperature (about 20° C. to about 25° C.) to about 40° C. The surface modification composition may remain in contact with the features for a shorter amount of time at a higher temperature.

After the surface of the features is modified, at least one additional rinse act 108 may be conducted to remove the surface modification composition from between the features. Since the surface of the features has been modified and its hydrophobicity increased, capillary forces between the features are reduced. Thus, wet chemistries used in any subsequently-conducted process acts (e.g., post-formation process acts) may be repelled from between the features. By way of example only, the substrate including the features may be rinsed, such as with IPA or other azeotropic solvent. The azeotropic solvent may contact the features for an amount of time sufficient of from about 10 seconds to about 120 seconds, from about 30 seconds to about 90 seconds, or from about 30 seconds to about 60 seconds. A drying act 110 may then be conducted, such as by exposing the substrate to heat or to an inert gas, such as nitrogen ($N_2$). The features modified according to embodiments of the disclosure may exhibit reduced or zero toppling compared to features exposed to conventional surface modification compositions, such as HMDS-based compositions.

Accordingly, a method of modifying a silicon-based material is disclosed. The method comprises forming a silicon-based material on a substrate and exposing the silicon-based material to a composition comprising a silylation agent comprising a silyl acetamide, a silylation catalyst comprising a perfluoro acid anhydride, an amine-based complexing agent, and an organic solvent.

The features formed from the silicon-based material may be HAR structures including a single silicon-based material, such as silicon, silicon oxide, or silicon nitride, or may include multiple silicon-based materials, such as layers or other three-dimensional configurations of silicon-based materials. The silicon-based material may be grown or formed on the substrate by conventional techniques including, but not limited to, chemical vapor deposition (CVD), physical vapor deposition (PVD), or atomic layer deposition (ALD). By way of example only, the HAR structures may be stacks that include layers of at least two of silicon, silicon oxide, or silicon nitride. In some embodiments, the HAR structures are shallow trench isolation (STI) stacks including silicon, silicon oxide on the silicon, and silicon nitride on the silicon oxide. In other embodiments, the HAR structures are three-dimensional (3D) cross-point memory structures that include a chalcogenide material and the silicon-based material, such as silicon nitride, on the chalcogenide material. While embodiments of the HAR structures are described as being stacks of silicon, silicon oxide, and silicon nitride, other HAR structures including the one or more silicon-based materials are contemplated. Thus, the surface modification composition may be used in other situations where toppling of HAR structures formed from a silicon-based material occurs. The HAR structures may be formed by conventional techniques, which are not described in detail herein. For example, the HAR structures may be formed by depositing the one or more silicon-based materials as layers on the substrate and removing portions of the silicon-based materials, such as by conventional photolithographic techniques.

Methods of modifying the HAR structures are as illustrated in the flowchart of FIG. 3 and as described above. The HAR structures on the substrate have aspect ratios of greater than or equal to about 10:1 and adjacent HAR structures are spaced apart from one other by less than or equal to about 100 nm. The HAR structures are exposed to a surface treatment act 102, followed by at least one rinse act 104. The surface of the HAR structures may then be modified by conducting the surface modification act 106. The substrate may be exposed to a surface modification composition according to embodiments of the disclosure. After modifying the surface of the HAR structures, the at least one additional rinse act 108 may be conducted to remove the surface modification composition from between the HAR structures. Since the surface of the HAR structures has been modified and its hydrophobicity increased, capillary forces between the HAR structures are reduced. Thus, wet chemistries used in any subsequently-conducted process acts may be repelled from between the HAR structures. The drying act 110 may then be conducted. The HAR structures exposed to embodiments of the above-mentioned methods and surface modification composition may have reduced or zero toppling compared to HAR structures exposed to conventional surface modification compositions and methods.

After the drying act 110, additional process acts may be conducted to form a complete semiconductor device structure, such as a DRAM or a 3D cross-point memory structure. The additional process acts may be formed by conventional techniques, which are not described in detail herein.

Accordingly, a method of forming high aspect ratio structures on a substrate is disclosed. The method comprises removing portions of a silicon-based material on a substrate to form silicon-based features having an aspect ratio of greater than about 20:1. The silicon-based features are exposed to a composition comprising a silylation agent comprising a silyl acetamide, a silylation catalyst comprising a perfluoro acid anhydride, an amine-based complexing agent, and an organic solvent.

Without being bound by any theory, it is believed that the surface modification act 106 occurs by reacting the silylation agent with hydroxyl groups or amine groups of the silicon-based material. The silicon-oxygen and silicon-nitrogen bonds are polar and the oxygen atom of the hydroxyl groups or the nitrogen atom of the amine groups reacts with the silicon atom of the silylation agent, with elimination of an N-(trialkylsilyl)acetamide group or an N-(trialkylsilyl)halo-acetamide, each of which is stable. The nonpolar groups of the modified silicon-based material are stable and exhibit increased contact angles compared to the unmodified surface. It is also believed that the carbon-nitrogen double bond of the silylation agent provides a cleaving site during the silylation reaction.

Without being bound by any theory, it is believed that when the chelating agent is present in the surface modification composition, the carboxylic acid groups of the α-hydroxy carboxylic acid react with silicon atoms on the surface of the silicon-based material to form a chelate or complex. The silylation agent may then react with the α-hydroxy group(s) of the chelate of the silicon-based material/α-hydroxy carboxylic acid.

The following examples serve to explain embodiments of the disclosure in more detail. These examples are not to be construed as being exhaustive or exclusive as to the scope of this disclosure.

Examples

Surface Modification Compositions

A composition including 10 ml of BSA, 0.1 ml of TFAA, 0.3 ml of EDA, and 60 ml of PGMEA was prepared and is referred to herein as Surface Modification Composition 1 (SM1).

A composition including 10 ml of BSA, 0.1 ml of TFAA, 0.3 ml of EDA, 0.39 mM of citric acid, and 60 ml of DMA was prepared and is referred to herein as Surface Modification Composition 2.

Contact Angles for $SiO_2$ and SiN Wafers

Contact angles were measured for silicon dioxide ($SiO_2$) wafers and silicon nitride (SiN) wafers exposed to the Surface Modification Composition 1 (SM1). The contact angles were compared to that of a control composition including hexamethyldisiloxane (HMDS) as the silylation agent as shown in Table 1. The contact angles were measured by conventional techniques.

TABLE 1

Contact Angles for $SiO_2$, SiN, and $O_2$ plasma treated SiN wafers.

| Surface Modification | Blanket substrate | Surface treatment | Temp (° C.) | Process time (sec) | Contact angle (degrees) |
|---|---|---|---|---|---|
| Control | $SiO_2$ | dilute HF | RT | 20 | 82 |
| Control | $SiO_2$ | Citric acid | RT | 20 | 87 |
| Control | SiN | dilute HF | RT | 20 | 45 |
| Control | SiN | Citric acid | RT | 20 | 58 |
| SM1 | $SiO_2$ | dilute HF | RT | 20 | 99 |
| SM1 | $SiO_2$ | Citric acid | RT | 20 | 110 |
| SM1 | SiN | dilute HF | RT | 20 | 60 |
| SM1 | SiN | Citric acid | RT | 20 | 76 |

TABLE 1-continued

Contact Angles for $SiO_2$, SiN, and $O_2$ plasma treated SiN wafers.

| Surface Modification | Blanket substrate | Surface treatment | Temp (° C.) | Process time (sec) | Contact angle (degrees) |
|---|---|---|---|---|---|
| SM1 | $O_2$ Plasma treated SiN | dilute HF | RT | 20 | 77 |
| SM1 | $O_2$ Plasma treated SiN | dilute SC1 | RT | 20 | 88 |
| SM1 | $O_2$ Plasma treated SiN | Citric acid | RT | 20 | 93 |
| SM1 | $O_2$ Plasma treated SiN | Tartaric acid | RT | 20 | 100 |

Figure 4:
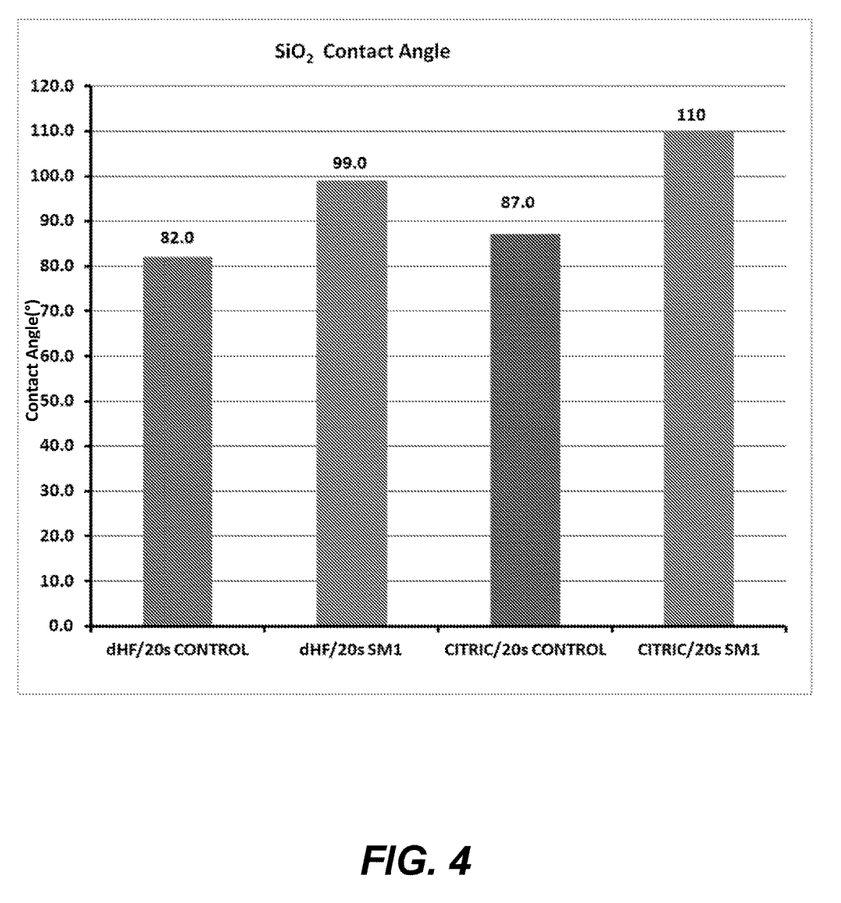
FIG. 4 is a graph of contact angle on silicon dioxide wafers for a control composition and a surface modification composition according to an embodiment of the disclosure.

The $SiO_2$ wafers were rinsed with dilute HF or 0.8 wt % citric acid to prepare the surface of the wafers, and then exposed to the Surface Modification Composition 1 or the HMDS-based control composition for 20 seconds. As shown in Table 1 and FIG. 4, the $SiO_2$ wafers exposed to the Surface Modification Composition 1 exhibited higher contact angles than those exposed to the HMDS-based control compositions. Following the HF rinse, the $SiO_2$ wafer exposed to the Surface Modification Composition 1 exhibited a contact angle of 99°, greater than the 82° contact angle of the HMDS-based control composition. Following the citric acid rinse, the $SiO_2$ wafer exposed to the Surface Modification Composition 1 exhibited a contact angle of 110°, greater than the 87° contact angle of the HMDS-based control composition. Thus, exposure to the Surface Modification Composition 1 was found to increase the contact angle of the $SiO_2$ wafers.

Figure 5:
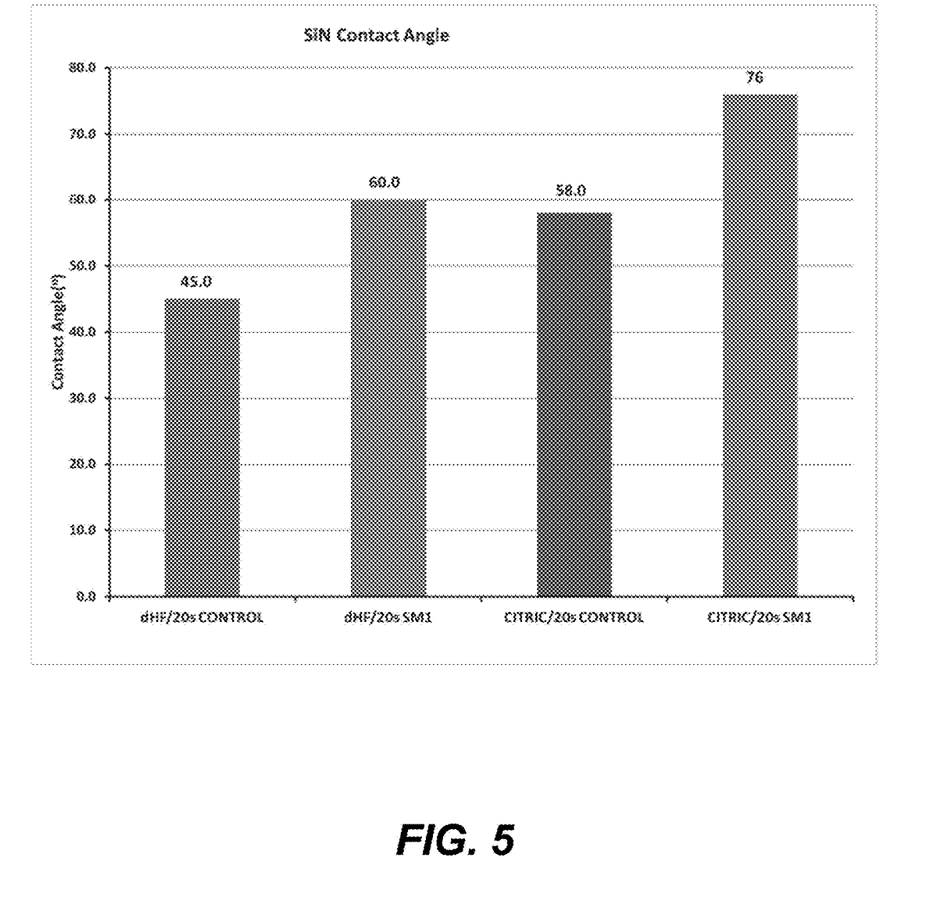
FIG. 5 is a graph of contact angle on silicon nitride wafers for a control composition and a surface modification composition according to an embodiment of the disclosure.

The SiN wafers were rinsed with dilute HF or 0.8 wt % citric acid to prepare the surface of the wafers, and then exposed to the Surface Modification Composition 1 or the HMDS-based control composition for 20 seconds. As shown in Table 1 and FIG. 5, the SiN wafers exposed to Surface Modification Composition 1 exhibited higher contact angles than those exposed to the HMDS-based control composition. Following the HF rinse, the SiN wafer exposed to Surface Modification Composition 1 exhibited a contact angle of 60°, greater than the 45° contact angle of the HMDS-based control composition. Following the citric acid rinse, the SiN wafer exposed to the Surface Modification Composition 1 exhibited a contact angle of 76°, greater than the 58° contact angle of the HMDS-based control composition.

Figure 6:
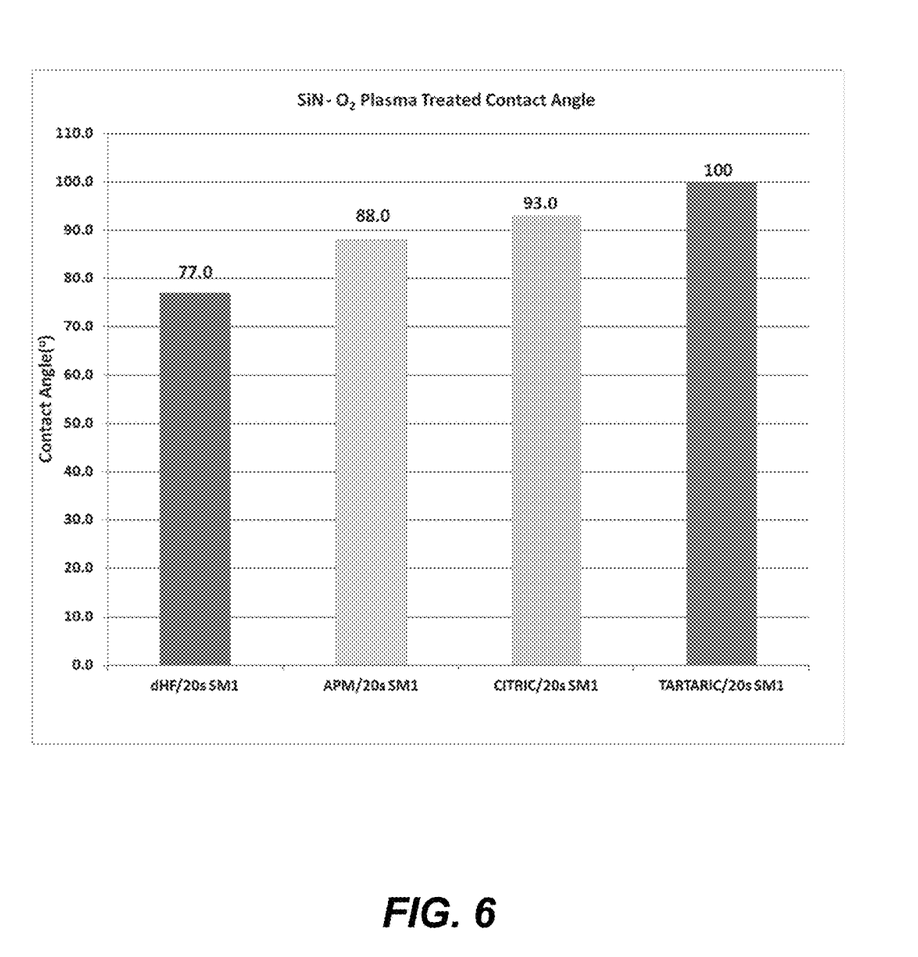
FIG. 6 is a graph of contact angle for surface modification compositions according to embodiments of the disclosure on plasma treated silicon nitride wafers.

SiN wafers were subjected to plasma treatment to determine the effect of surface termination on the contact angle. The SiN wafers were oxidized by exposure to oxygen ($O_2$) gas before rinsing the wafers with dilute HF, APM, 0.8 wt % citric acid, or 0.8 wt % tartaric acid. The SiN wafers were then exposed to the Surface Modification Composition 1 for 20 seconds. As shown in Table 1 and FIG. 6, when the plasma treated SiN wafer was rinsed with HF followed by exposure to the Surface Modification Composition 1, the SiN wafer exhibited a contact angle of 77° (compared to a contact angle of 60° for the SiN wafer not subjected to a plasma treatment). When the plasma treated SiN wafer was rinsed with APM followed by exposure to the Surface Modification Composition 1, the SiN wafer exhibited a contact angle of 88°. When the plasma treated SiN wafer was rinsed with citric acid followed by exposure to the Surface Modification Composition 1, the SiN wafer exhibited a contact angle of 93° (compared to a contact angle of 76° for the SiN wafer not subjected to a plasma treatment). When the plasma treated SiN wafer was rinsed with tartaric acid followed by exposure to the Surface Modification Composition 1, the SiN wafer exhibited a contact angle of 100°. The two α-hydroxy groups present in the tartaric acid compared to the one α-hydroxy group present in the citric acid are believed to provide the increased contact angle for the SiN wafer rinsed with tartaric acid.

Similar results (e.g., increase in contact angle) are achieved when SiO$_2$ wafers and SiN wafers are exposed to Surface Modification Composition 2.

Toppling of 22.2:1 HAR Structures

HAR structures including silicon, silicon oxide, and silicon nitride stacks and having an aspect ratio of 22.2:1 were formed on substrates by conventional techniques. The HAR structures were rinsed with dilute HF (dHF) or 0.8 wt % citric acid and then exposed to the Surface Modification Composition 1 or to the HMDS-based control composition. Toppling of the HAR structures was measured by conventional microinspection techniques and confirmed by scanning electron microscopy cross-section (X-SEM). The X-SEM results are not shown. As shown in Table 2, the HAR structures exposed to the HF or citric acid rinse followed by exposure to the Surface Modification Composition 1 produced zero toppling defects. In contrast, the HMDS-based control composition following the dilute HF rinse showed toppling defects.

TABLE 2

Toppling for Surface Modification Composition 1 and HMDS-based Control Composition.

| Active Area (AA) height (nm) | AA space (nm) | Space aspect Ratio (AR) | Clean | Surface Modification Chemistry (SMC) | SMC Process time (sec) | Microinspection defects (n/cm$^2$) |
|---|---|---|---|---|---|---|
| 235 | 10.6 | 22.2 | dHF | Control | 20 | 6.4 |
| 235 | 10.6 | 22.2 | dHF | SM1 | 20 | 0 |
| 235 | 10.6 | 22.2 | dHF | SM1 | 40 | 7.6 |
| 235 | 10.6 | 22.2 | dHF | SM1 | 60 | 9.4 |
| 235 | 10.6 | 22.2 | Citric acid | SM1 | 20 | 0 |
| 235 | 10.6 | 22.2 | Citric acid | SM1 | 40 | 0 |
| 235 | 10.6 | 22.2 | Citric acid | SM1 | 60 | 0 |

Similar results (e.g., reduction in toppling) are achieved when the 22.2:1 HAR structures including silicon, silicon oxide, and silicon nitride stacks are exposed to Surface Modification Composition 2.

Toppling of 26.3:1 HAR Structures

HAR structures including silicon, silicon oxide, and silicon nitride stacks and having an aspect ratio of 26.3:1 were formed on substrates by conventional techniques. The HAR structures were cleaned with dilute HF or 0.8 wt % citric acid and then exposed to the Surface Modification Composition 1 or to the HMDS-based control composition. Toppling of the HAR structures was measured by conventional SEM sampling techniques and confirmed by scanning electron microscopy cross-section (X-SEM). The X-SEM results are not shown. As shown in Table 3, the HAR structures exposed to the HF or citric acid rinse followed by exposure to the Surface Modification Composition 1 produced a three-fold improvement in toppling compared to the HMDS-based control composition. The Surface Modification Composition 1 following the citric acid rinse also resulted in an improvement in toppling compared to the HMDS-based control composition.

TABLE 3

Toppling for Surface Modification Composition 1 and HMDS-based Control Composition.

| Active Area (AA) height (nm) | AA space (nm) | Space aspect Ratio (AR) | Clean | Surface Modification Chemistry (SMC) | SMC Process time (sec) | SEM sampling defects (M/cm$^2$) |
|---|---|---|---|---|---|---|
| 329 | 12.5 | 26.3 | dHF | Control | 20 | 1525 |
| 329 | 12.5 | 26.3 | dHF | SM1 | 20 | 601 |
| 329 | 12.5 | 26.3 | dHF | SM1 | 40 | 554 |
| 329 | 12.5 | 26.3 | dHF | SM1 | 60 | 654 |
| 329 | 12.5 | 26.3 | Citric acid | SM1 | 20 | 563 |
| 329 | 12.5 | 26.3 | Citric acid | SM1 | 40 | 380 |
| 329 | 12.5 | 26.3 | Citric acid | SM1 | 60 | 403 |

Note:
M = million

Similar results (e.g., reduction in toppling) are achieved when the 26.3:1 HAR structures including silicon, silicon oxide, and silicon nitride stacks are exposed to Surface Modification Composition 2.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A surface modification composition comprising:
    a silylation agent comprising a silyl acetamide;
    a silylation catalyst comprising a perfluoro acid anhydride;
    an amine-based complexing agent; and
    an organic solvent.

2. The surface modification composition of claim 1, wherein the silylation agent comprises an N,O-bis(trialkylsilyl)acetamide, an N,O-bis(trialkylsilyl)haloacetamide, or combinations thereof.

3. The surface modification composition of claim 1, wherein the silylation agent comprises N,O-bis(trimethylsilyl)acetamide (BSA), N,O-bis(triethylsilyl)acetamide, N,O-bis(tripropylsilyl)acetamide, N,O-bis(trimethylsilyl)trifluoroacetamide (BSTFA), or combinations thereof.

4. The surface modification composition of claim 1, wherein the silylation catalyst comprises trifluoroacetic anhydride (TFAA), pentafluoropropionic anhydride (PFPA), heptafluorobutyric anhydride (HFBA), or combinations thereof.

5. The surface modification composition of claim 1, wherein the amine-based complexing agent comprises ethylenediamine (EDA), diethylenetriamine, trimethylenediamine (TMEDA), triethylenetetramine, pentaethylenehexamine, N,N-dimethyltrimethylenediamine, tetraethylenepentamine (TEPA), N,N-diisopropylethylamine, triethylamine (TEA), imidazole, 4-dimethylaminopyridine (DMAP), 3-amino-2,6-dimethylpyridine, or combinations thereof.

6. The surface modification composition of claim 1, wherein the organic solvent comprises an ester solvent, an ether solvent, an acetate solvent, or an amide solvent.

7. The surface modification composition of claim 1, wherein the organic solvent comprises propylene glycol monomethyl ether acetate (PGMEA), tetrahydrofurfuryl acetate (THFAC), dimethylacetamide (DMA), propylene carbonate (PC), or combinations thereof.

8. The surface modification composition of claim 1, wherein the silylation agent comprises from about 1 wt % to about 20 wt % of the surface modification composition, the silylation catalyst comprises from about 0.05 wt % to about 5 wt % of the surface modification composition, the amine-based complexing agent comprises from about 0.05 wt % to about 5 wt % of the surface modification composition, and the organic solvent comprises the remainder of the surface modification composition.

9. The surface modification composition of claim 1, further comprising a chelating agent comprising a α-hydroxyl dicarboxylic acid or a α-hydroxyl polycarboxylic acid.

10. The surface modification composition of claim 9, wherein the chelating agent comprises citric acid, lactic acid, malic acid, glycolic acid, tartaric acid, mandelic acid, (R)-(−)-citramalic acid, gluconic acid, gallic acid, or combinations thereof.

11. The surface modification composition of claim 1, wherein the surface modification composition comprises N,O-bis(trimethylsilyl)acetamide (BSA), trifluoroacetic anhydride (TFAA), ethylenediamine (EDA), and propylene glycol monomethyl ether acetate (PGMEA).

12. The surface modification composition of claim 11, further comprising citric acid.

13. The surface modification composition of claim 11, further comprising tartaric acid.

14. The surface modification composition of claim 1, wherein the surface modification composition comprises N,O-bis(trimethylsilyl)acetamide (BSTFA), trifluoroacetic anhydride (TFAA), ethylenediamine (EDA), and propylene glycol monomethyl ether acetate (PGMEA).

15. A method of modifying a silicon-based material, comprising:
exposing a silicon-based material to a composition comprising a silylation agent comprising a silyl acetamide, a silylation catalyst comprising a perfluoro acid anhydride, an amine-based complexing agent, and an organic solvent.

16. The method of claim 15, wherein exposing a silicon-based material to a composition comprises forming features from the silicon-based material, the features comprising an aspect ratio of greater than about 10:1.

17. The method of claim 15, wherein exposing a silicon-based material to a composition comprises forming features from the silicon-based material, the features comprising an aspect ratio of greater than about than 22:1.

18. The method of claim 15, wherein exposing a silicon-based material to a composition comprises reacting the silylation agent with the silicon-based material.

19. A method of forming high aspect ratio structures on a substrate, comprising:
removing portions of a silicon-based material on a substrate to form silicon-based features having an aspect ratio of greater than about 20:1; and
exposing the silicon-based features to a silicon modification composition comprising a silylation agent comprising a silyl acetamide, a silylation catalyst comprising a perfluoro acid anhydride, an amine-based complexing agent, and an organic solvent.

20. The method of claim 19, wherein exposing the silicon-based features to a silicon modification composition further comprises including an α-hydroxyl dicarboxylic acid or an α-hydroxyl polycarboxylic acid in the silicon modification composition.

21. The method of claim 19, further comprising exposing the silicon-based features to dilute hydrogen fluoride, ammonium hydroxide, or an ammonium peroxide mixture before exposing the silicon-based features to the silicon modification composition.

22. The method of claim 19, further comprising rinsing the silicon-based features with water before exposing the silicon-based features to the silicon modification composition.

23. The method of claim 19, further comprising rinsing the silicon-based features with isopropanol before exposing the silicon-based features to the silicon modification composition.

24. The method of claim 19, further comprising drying the substrate after exposing the silicon-based features to the silicon modification composition.

25. The method of claim 19, further comprising exposing the silicon-based features to an α-hydroxyl dicarboxylic acid or an α-hydroxyl polycarboxylic acid before exposing the silicon-based features to the silicon modification composition.

* * * * *

UNITED STATES PATENT AND TRADEMARK OFFICE
CERTIFICATE OF CORRECTION

| | | |
|---|---|---|
| PATENT NO. | : 9,653,307 B1 | |
| APPLICATION NO. | : 15/210249 | |
| DATED | : May 16, 2017 | |
| INVENTOR(S) | : Jerome A. Imonigie et al. | |

It is certified that error appears in the above-identified patent and that said Letters Patent is hereby corrected as shown below:

In the Specification

Column 4,    Line 17,    change "("SOT") substrates," to --("SOI") substrates,--

Signed and Sealed this
First Day of August, 2017

Joseph Matal
*Performing the Functions and Duties of the
Under Secretary of Commerce for Intellectual Property and
Director of the United States Patent and Trademark Office*